United States Patent
Bhardwaj et al.

(10) Patent No.: US 11,961,220 B2
(45) Date of Patent: Apr. 16, 2024

(54) HANDLING INTEGRATED CIRCUITS IN AUTOMATED TESTING

(71) Applicant: TEXAS INSTRUMENTS INCORPORATED, Dallas, TX (US)

(72) Inventors: Neeraj Bhardwaj, Karnataka (IN); Neha Vernekar, Karnataka (IN); Janardhan Venkata Raju, Bangalore (IN); Shubham Mehrotra, Karnataka (IN); Arun Adoni, Karnataka (IN); Mahit Arun Warhadpande, Karnataka (IN); Shimee Gupta, Bangalore (IN); Goda Devi Addanki, Bangalore (IN); Pavinkumar Ramasamy, Karnataka (IN); Binoy Jose Maliakal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1151 days.

(21) Appl. No.: 15/925,008

(22) Filed: Mar. 19, 2018

(65) Prior Publication Data
US 2019/0227117 A1     Jul. 25, 2019

(30) Foreign Application Priority Data
Jan. 23, 2018   (IN) .............................. 201841002708

(51) Int. Cl.
*G01R 31/20*   (2006.01)
*G01R 1/04*    (2006.01)
(Continued)

(52) U.S. Cl.
CPC .......... *G06T 7/0008* (2013.01); *G01R 1/0441* (2013.01); *G01R 31/2887* (2013.01); *G01R 31/2893* (2013.01)

(58) Field of Classification Search
CPC ............ G01R 31/2891; G01R 31/2893; G01R 31/2896; G01R 31/2886; G01R 31/2877;
(Continued)

(56) References Cited

U.S. PATENT DOCUMENTS

| 3,677,401 A | 7/1972 | Chaparro et al. |
| 5,566,188 A | 10/1996 | Robbins et al. |

(Continued)

*Primary Examiner* — Thang X Le
(74) *Attorney, Agent, or Firm* — Ronald O. Neerings; Frank D. Cimino

(57) ABSTRACT

Apparatuses and methods are disclosed for handling integrated circuits in automated testing. The handler apparatus includes an upper assembly that is selectively translatable above a testing surface and a lower bracket extending from and positioned below the upper assembly. The lower bracket forms a first opening, is selectively moveable upward and downward, and includes a rotatable finger extending downward to pick up and place an integrated circuit in a socket. The handier may further include an image sensor to detect potential error conditions, and a tool extending from the lower bracket to open and close a lid on the socket. The methods include sensing an image of an integrated circuit during certain phases of testing, analyzing the image to determine if the integrated circuit is positioned correctly, and correcting any detected error conditions before continuing with the automated testing.

20 Claims, 19 Drawing Sheets

(51) Int. Cl.
  *G01R 31/28* (2006.01)
  *G06T 7/00* (2017.01)
(58) Field of Classification Search
  CPC .............. G01R 31/2887; G01R 31/043; G01R 31/0433; G01R 31/0483; G01R 31/0466; G01R 31/2851; G01R 1/0416; G01R 1/0441; G01R 1/0458; G01R 1/0466; G01R 1/7342; G01R 1/06705; G01R 1/06794; G01R 1/07314; G01R 1/06711; G01R 1/06772; G01R 31/31924; G01R 31/3004; G01R 31/2884; G01R 31/31922; G01R 1/06738; G01R 1/07342
  See application file for complete search history.

(56) References Cited

U.S. PATENT DOCUMENTS

| | | | |
|---|---|---|---|
| 5,951,720 A * | 9/1999 | Arakawa | H05K 13/0486 29/25.01 |
| 6,704,883 B1 | 3/2004 | Peter et al. | |
| 6,873,927 B2 | 3/2005 | Chi et al. | |
| 2001/0026152 A1 * | 10/2001 | Kang | G01R 31/2867 324/750.2 |
| 2002/0026258 A1 * | 2/2002 | Suzuki | B65G 57/04 700/112 |
| 2005/0200000 A1 * | 9/2005 | Ham | G01R 31/2893 257/712 |
| 2008/0298946 A1 * | 12/2008 | Shim | G01R 31/2893 414/749.1 |
| 2009/0009202 A1 * | 1/2009 | Cram | G01R 31/2891 324/750.02 |
| 2010/0104404 A1 * | 4/2010 | Yokoo | G01R 31/2893 414/226.01 |
| 2012/0033208 A1 * | 2/2012 | Hara | G02B 6/4292 356/244 |
| 2017/0146566 A1 * | 5/2017 | Eldridge | G01R 1/0441 |
| 2017/0285102 A1 * | 10/2017 | Ding | G01R 1/07314 |
| 2017/0315150 A1 * | 11/2017 | Park | G01R 1/0433 |
| 2018/0172760 A1 * | 6/2018 | Leikermoser | G01R 31/286 |
| 2019/0064305 A1 * | 2/2019 | Khalid | G01R 31/2834 |

* cited by examiner

HANDLING INTEGRATED CIRCUITS IN AUTOMATED TESTING

BACKGROUND

An integrated circuit often undergoes certain functional and environmental testing as a part of the manufacturing process. These integrated circuits are typically manufactured in large batches in which each device must be tested to determine whether it is defective or otherwise non-functional. In the case of complex integrated circuits, a batch of these devices may be delivered to a test station or test bench, whereupon each device is successively picked up from a tray, placed into a socket on a specialized printed circuit (PC) board, and then run through a battery of functional tests. Testing may also include operation of the integrated circuit under controlled environmental conditions, such as hot or cold conditions. The socket used for holding the integrated circuit in electrical contact with the PC board often includes a type of lid which must be closed in order to secure the integrated circuit and make electrical contact to enable the testing, and then opened after testing is complete in order to remove the integrated circuit. In this process, it may be necessary for a human operator or technician to pick up each integrated circuit from the tray, place each integrated circuit into the testing socket, secure the socket lid, and/or otherwise supervise or interact with the testing process.

BRIEF DESCRIPTION OF THE DRAWINGS

For a detailed description of various examples, reference will now be made to the accompanying drawings in which.

DETAILED DESCRIPTION

Certain devices often referred to as "handlers" may be used to assist engineers or technicians in handling integrated circuits during automated testing. For example, such a handler may be used to pick up individual integrated circuits from a tray and sequentially place each integrated circuit into a testing socket. However, existing handlers may be unable to open and close the various types of lids often found on sockets used during automated testing. Thus, an operator or technician may be required to manually open and close the lid of the socket for each testing cycle. In addition, the specialized equipment used for testing the thermal performance of integrated circuits may often block overhead access to the testing socket. This thermal testing equipment may thus prevent the use of certain handlers that must approach the socket from overhead. Thus, an operator or technician may again be required to manually perform all of the thermal testing procedures.

Existing handlers may also require close supervision by an operator or technician to detect certain error conditions which, if not corrected, could cause erroneous results or damage the integrated circuit, the testing socket, or the test equipment. For example, existing handlers may not detect when an integrated circuit is missing from a position in a tray of integrated circuits. Similarly, existing handlers may be incapable of detecting a missing integrated circuit from a testing socket. Likewise, existing handlers may not be capable of detecting an integrated circuit having an incorrect orientation in the tray of integrated circuits. In addition, existing handlers may be incapable of detecting when integrated circuits are tilted, shifted or rotated when initially placed in the testing socket. If the lid of the socket is forced to close in these circumstances, the integrated circuit and/or the testing socket may be damaged or destroyed. Preventing or correcting all of these potential error conditions may require close supervision by an operator or technician, and may drastically slow or stop further testing. Any manual supervision or intervention during automated testing may also adversely impact the speed of the testing process and the volume of integrated circuits tested at each test station. Manual intervention may also be very inefficient because the operator or technician is often idle during the testing process. A requirement for manual intervention may also limit testing to normal working hours, thus limiting the maximum daily volume of tests.

Figure 1:
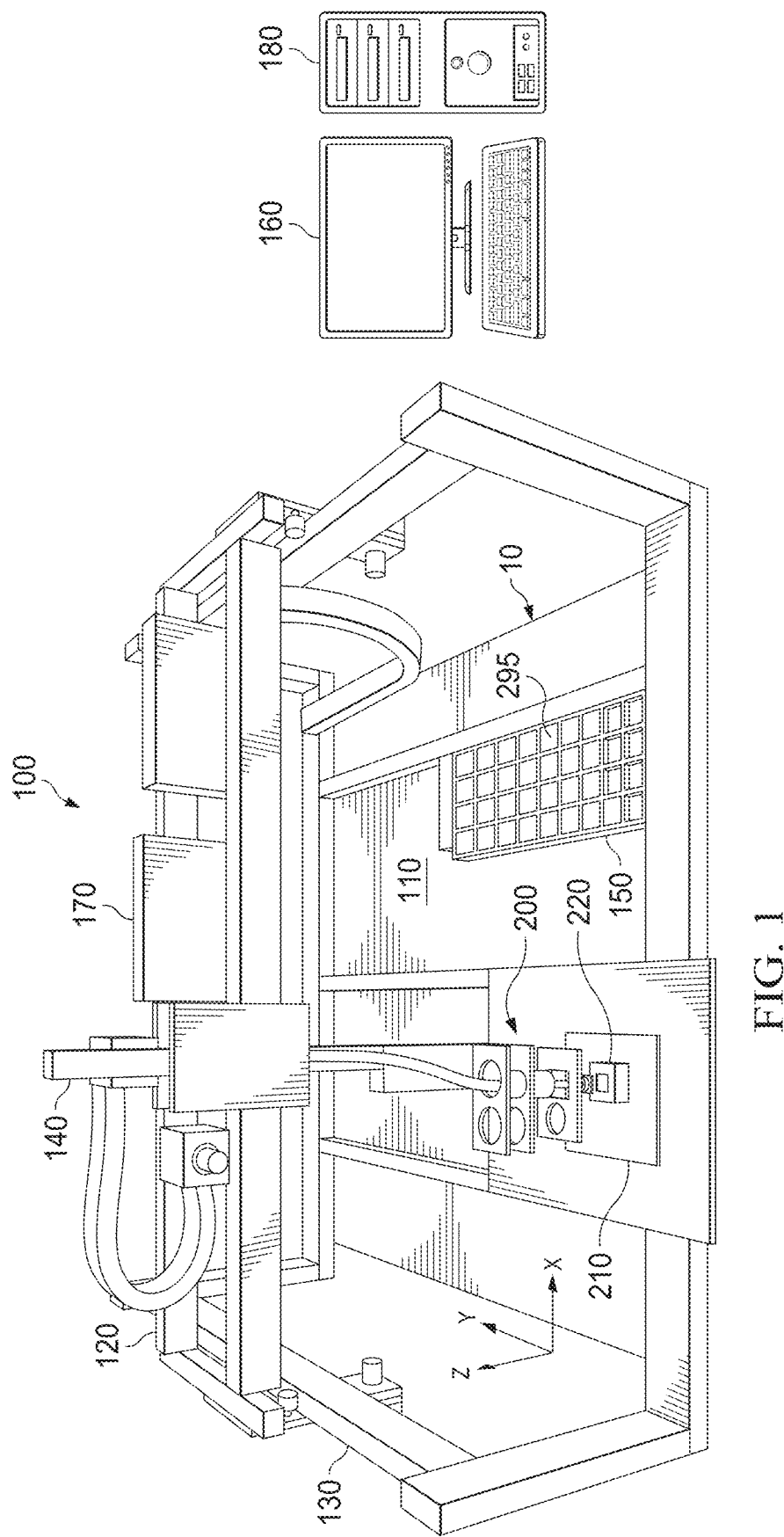
FIG. 1 is a perspective view illustrating an example of a test bench with a handler and support structure positioned thereon.

FIG. 1 shows a test bench 10, such as may be employed at a station for testing integrated circuits. The test bench 10 often has a flat testing surface 110 which forms a plane. For the purpose of illustration, FIG. 1 depicts orthogonal X and Y axes in the plane formed by the flat testing surface 110. When used at larger testing facilities, the test bench 10 may be situated in a room with multiple other test benches 10.

After integrated circuits are manufactured and are ready for testing, a batch of multiple integrated circuits 295 may be placed in particular positions on a tray 150. The tray 150 is then placed at a predetermined position on the testing surface 110 of test bench 10. Each of the integrated circuits 295 is then picked up from the tray 150 and placed in a socket 220 for testing. As discussed in more detail below, socket 220 often has a lid or other closing mechanism that is closed or actuated in order to make electrical contact between the pins of integrated circuit 295 and the socket 220.

Socket 220 is positioned on a PC board 210, which may be connected to a computer 180 in order to facilitate the execution of diagnostic procedures on the integrated circuit 295. By way of example, automated testing may be controlled with computer 160 by using TestStand® software sold by National Instruments of Austin, TX.

A handler 200 is used to pick up the integrated circuits 295 from tray 150, move the integrated circuits to the socket 220, and close the lid on the socket 220. After the testing procedures have finished executing, the handler 200 then opens the lid on socket 220, retrieves the integrated circuit 295, and replaces the integrated circuit 295 in the tray 150. This cycle is then repeated for the next adjacent integrated circuit 295 in the tray 150.

In order to perform these steps in the process of testing integrated circuits 295, the trajectory of the handler 200 is translated in the X and directions, and moved up and down in the Z directions, as illustrated by the X, Y, and Z axes in FIG. 1. To facilitate this translation and upward and downward movement, the handler 200 may be mounted on a support frame 100, which generally acts as a gantry positioned over the test bench 10.

FIG. 1 illustrates one example wherein support frame 100 is supported above testing surface 110. Two Y support rails 130 extend parallel to the testing surface 110 in the Y direction. An X support rail 120 is supported by and translatable along the Y support rails 130. Likewise, a Z support rail 140 is supported by and translatable along the X support rail 120. The handler 200 is mounted at the bottom of the Z support rail 140. In this manner, the handler is selectively translatable in the X and Y directions above the testing surface 110. The handler is also selectively moveable in the Z direction perpendicular to the plane of the testing surface 110.

Movement in the X, Y, and Z directions may be controlled by a computer 160 which communicates with a microcontroller 170 to direct the movement of wheels, belts, chains, or actuators (not shown) which move the X support rail 120 and the Z support rail 140. Computer 160 may operate certain software, such as LabView) software sold by National Instruments of Austin, TX, in order to facilitate communicating with microcontroller 170 to control the automation of the support frame 100 and the handler 200.

Figure 2:
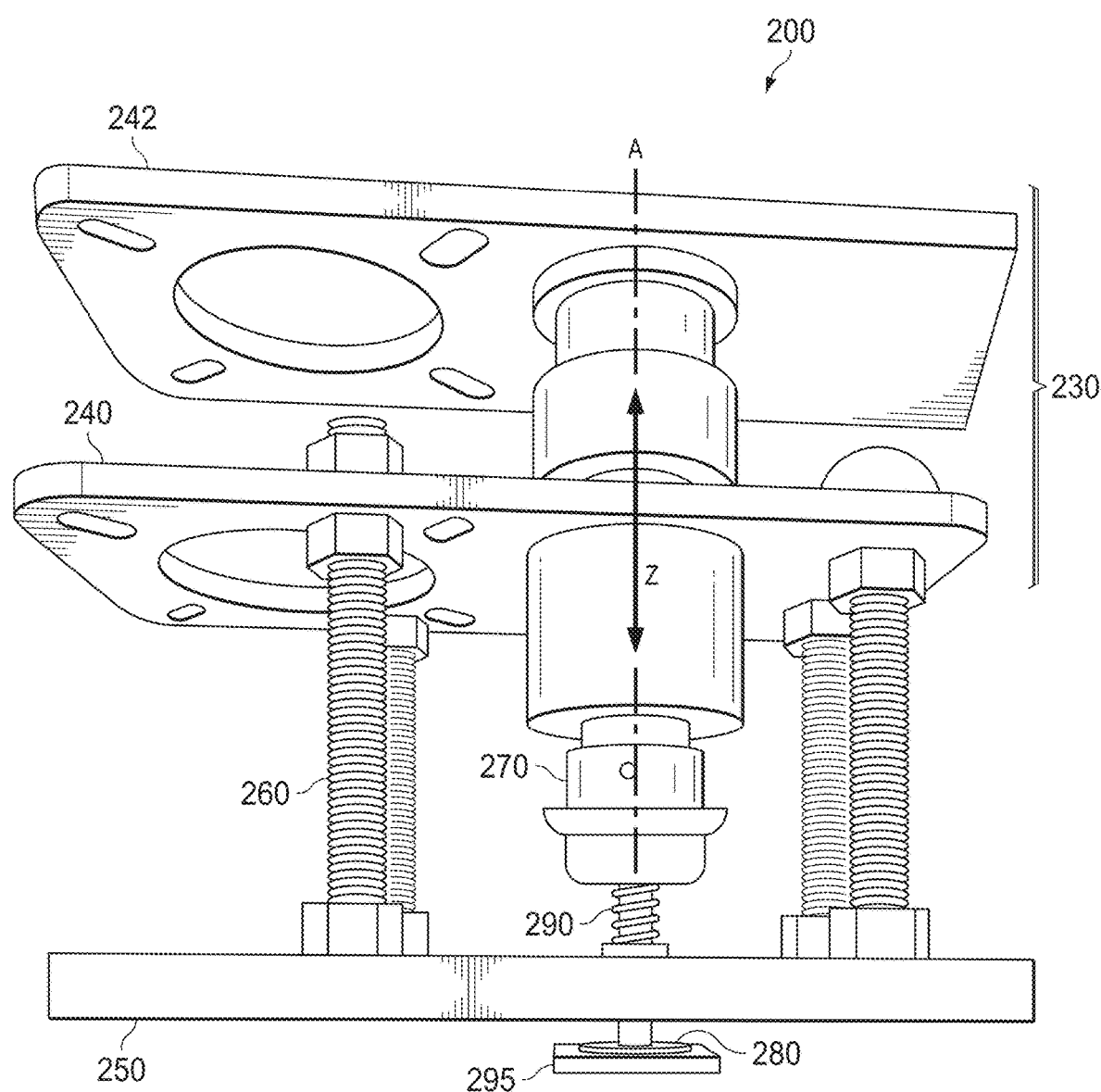
FIG. 2 is a perspective view of an example of a handler.

FIG. 2 depicts an example of a handler 200 mounted near the bottom of Z support rail 140. Handler 200 has an upper assembly 230 which may include upper brackets 240 and 242. Upper bracket 242 may be attached to Z support rail 140. Lower bracket 250 is positioned below upper bracket 240. An example of lower bracket 250 may be a flat, rigid structure that is supported below the upper bracket 240 by spacers 280. FIG. 2 illustrates spacers 260 as threaded members, so that the distance between the upper bracket 240 and the lower bracket 250 may be easily adjusted.

Handler 200 also includes a finger 270 that is supported by the upper assembly 230 and is moveable upward and downward in the Z direction with respect to the upper assembly 230. Embodiments of finger 270 may have an elongated longitudinal axis A that is aligned with the Z direction. The distal end of the finger 270 may be slidable along the longitudinal axis A and includes an axial spring 290 such that the slidable portion of the distal end is biased downward. The distal end of the finger 270 may also include a suction head 280 in order to better grip the flat surface of an integrated circuit 295, as shown in FIG. 2.

Referring to FIGS. 1 and 2, the handler 200 may be taught to mimic human behavior by manually moving the handler to a desired position that is useful in handling integrated circuits 295 during testing. For example, the handler 200 may be manually positioned at a particular height directly above an integrated circuit located in the tray 150. The finger 270 may then be manually lowered to precisely attach suction head 280 to integrated circuit 295. These positions may then be stored in memory 180 in the computer 160 and later replayed to automatically pick up an integrated circuit 285 from the tray 150 at the start of automated testing. By way of further example, a sequence of multiple positions of handler 200 may be recorded in memory 180 so as to mimic a human opening the lid of a clamshell socket 500 and to mimic a human removing the integrated circuit 295 after testing is complete, as illustrated and described in more detail in connection with FIGS. 5A-5D below.

Figure 3:
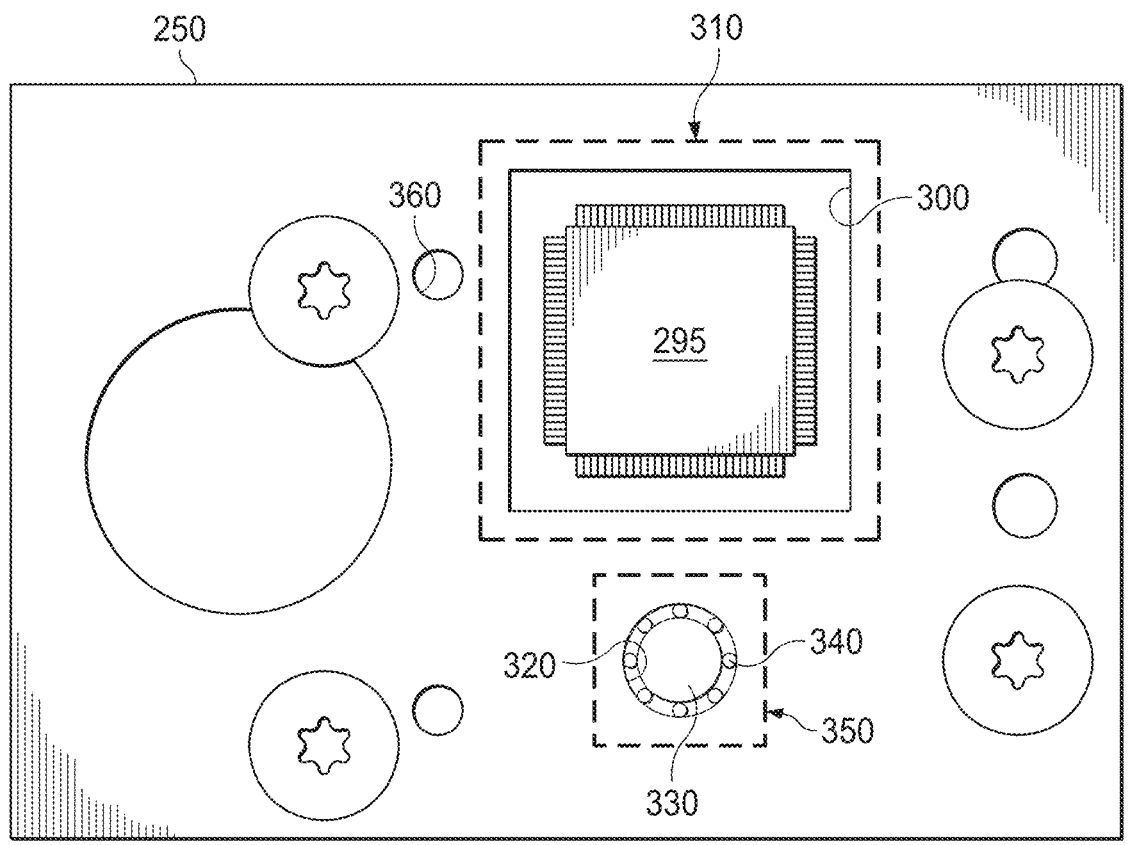
FIG. 3 is a bottom view of an example of a lower bracket of a handler.

FIG. 3 is a bottom view looking upward towards the handler 200 of FIG. 2. As shown therein, lower bracket 250 forms a first opening 300 which is large enough so that the integrated circuit 295 may pass through the opening 300. Lower bracket 250 may also form a second opening 320, which facilitates mounting an image sensor 330 on the lower bracket 250 so as to capture images of the integrated circuit 295 or socket 220 (FIG. 1) at various stages of the testing process.

By way of example, the image sensor 330 may be a digital camera. Alternatively, the image sensor 330 may be an endoscopic camera, which may beneficially have a short focusing distance and include a built-in illumination source such as light emitting diodes (LEDs) 340. As discussed in more detail below, images sensed by the image sensor 330 may be used to determine if an integrated circuit 295 is missing, incorrectly oriented, rotated, tilted, et, so that corrective action may be taken by the handler 200 without the need for human supervision or intervention.

As is also discussed in more detail below, the bottom surface of lower bracket 250 may be used as a tool to manipulate the lid or other closing mechanism of a socket 220 (FIG. 1). Portions of the lower bracket 250, including the perimeter portion 310 surrounding the first opening 300 and the perimeter portion 350 surrounding the second opening 320 may be used for such purposes. In addition, lower bracket 250 may include a plurality of holes 360 at different positions on the bottom surface. A variety of different tools may be attached to the lower bracket 250 at one or more of the holes 360 in order to more easily manipulate the lid or other closing mechanism of a socket 220 (FIG. 1).

Figure 4:
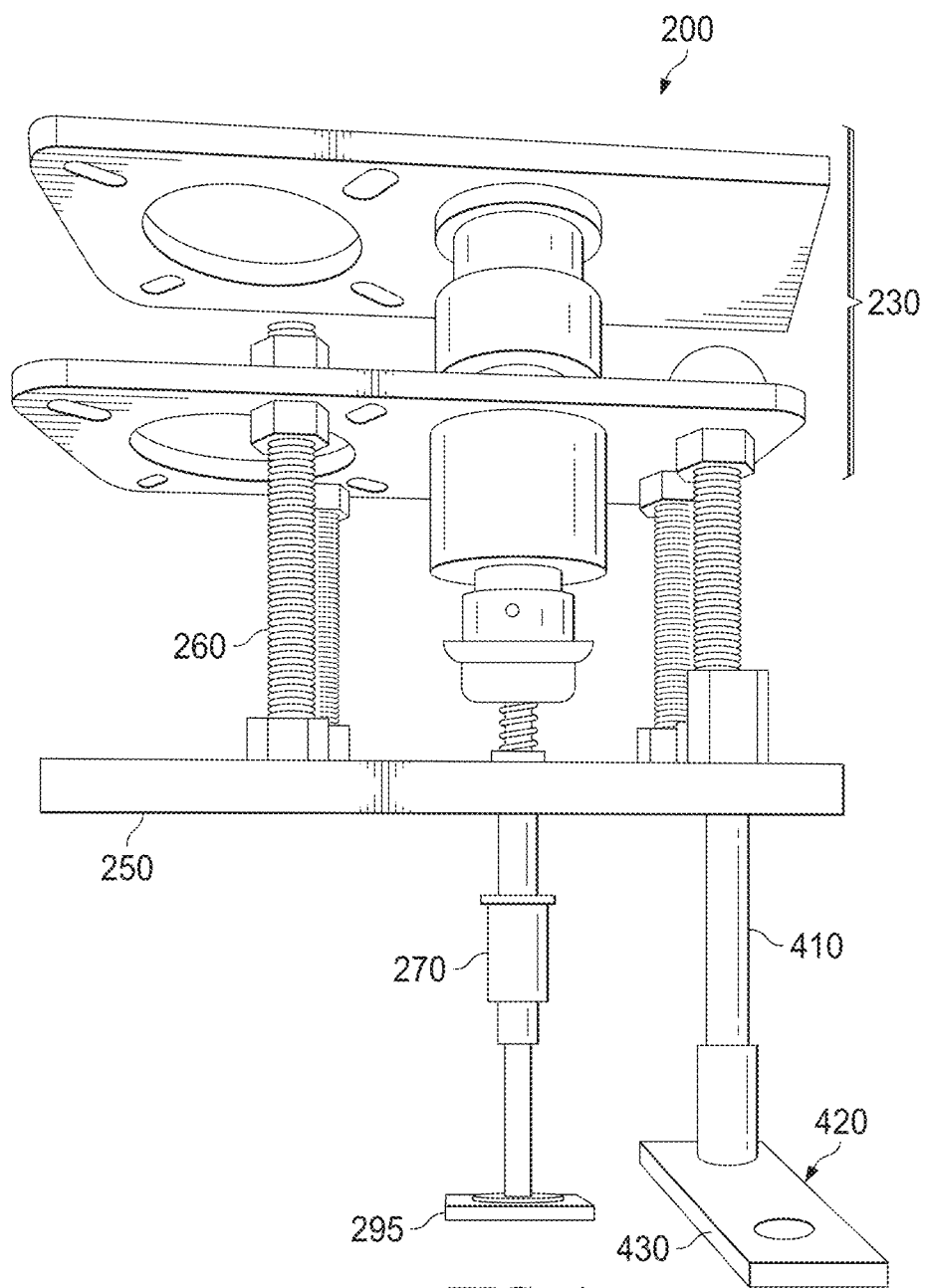
FIG. 4 is a perspective view of a handler with an example of a finger depicted holding an integrated circuit and an example of a tool extending from the lower bracket.
Figure 5A:
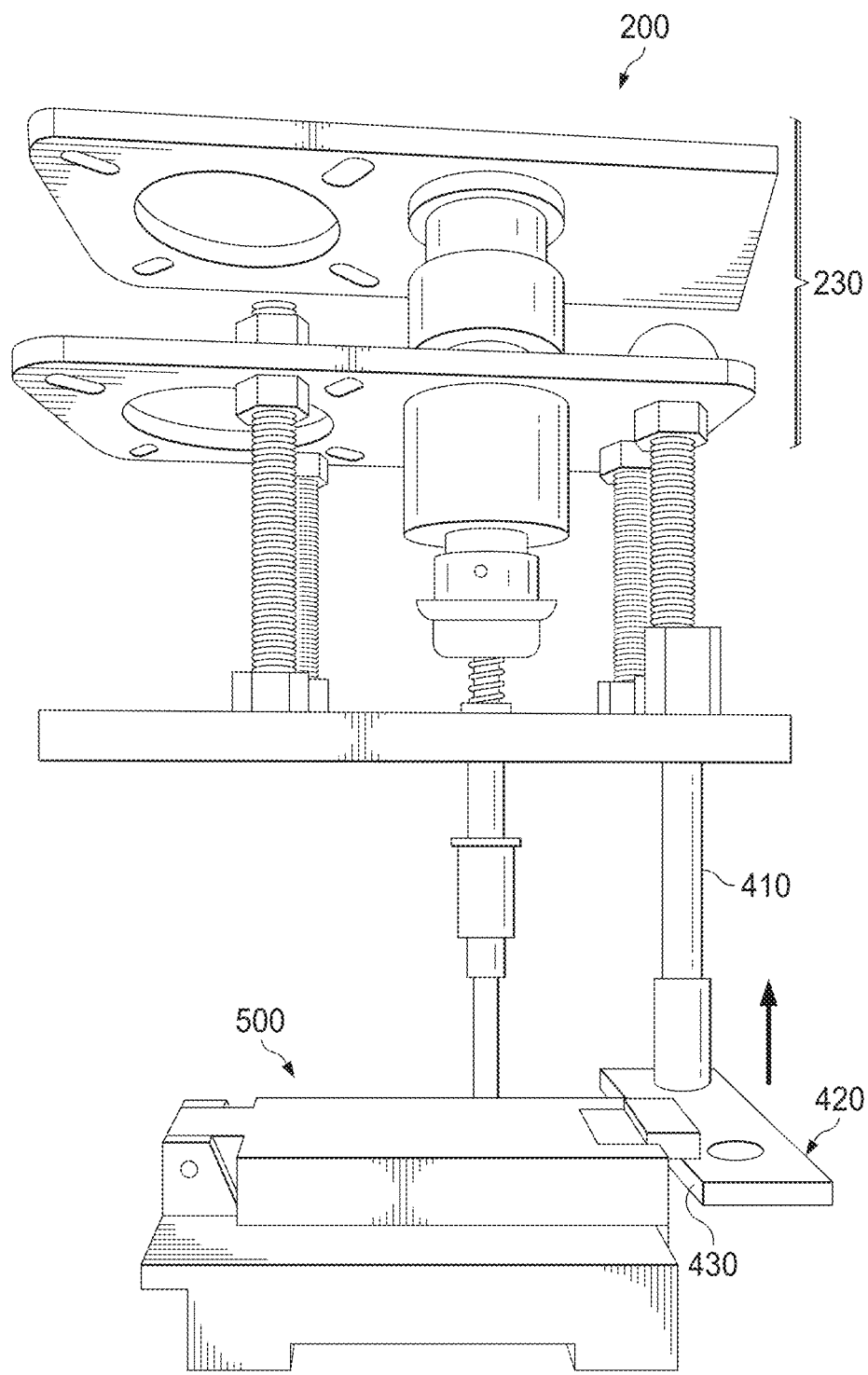
FIGS. 5A-5D are sequential perspective views of an example handler depicted opening the lid of a clamshell socket and placing an integrated circuit in the socket.
Figure 5B:
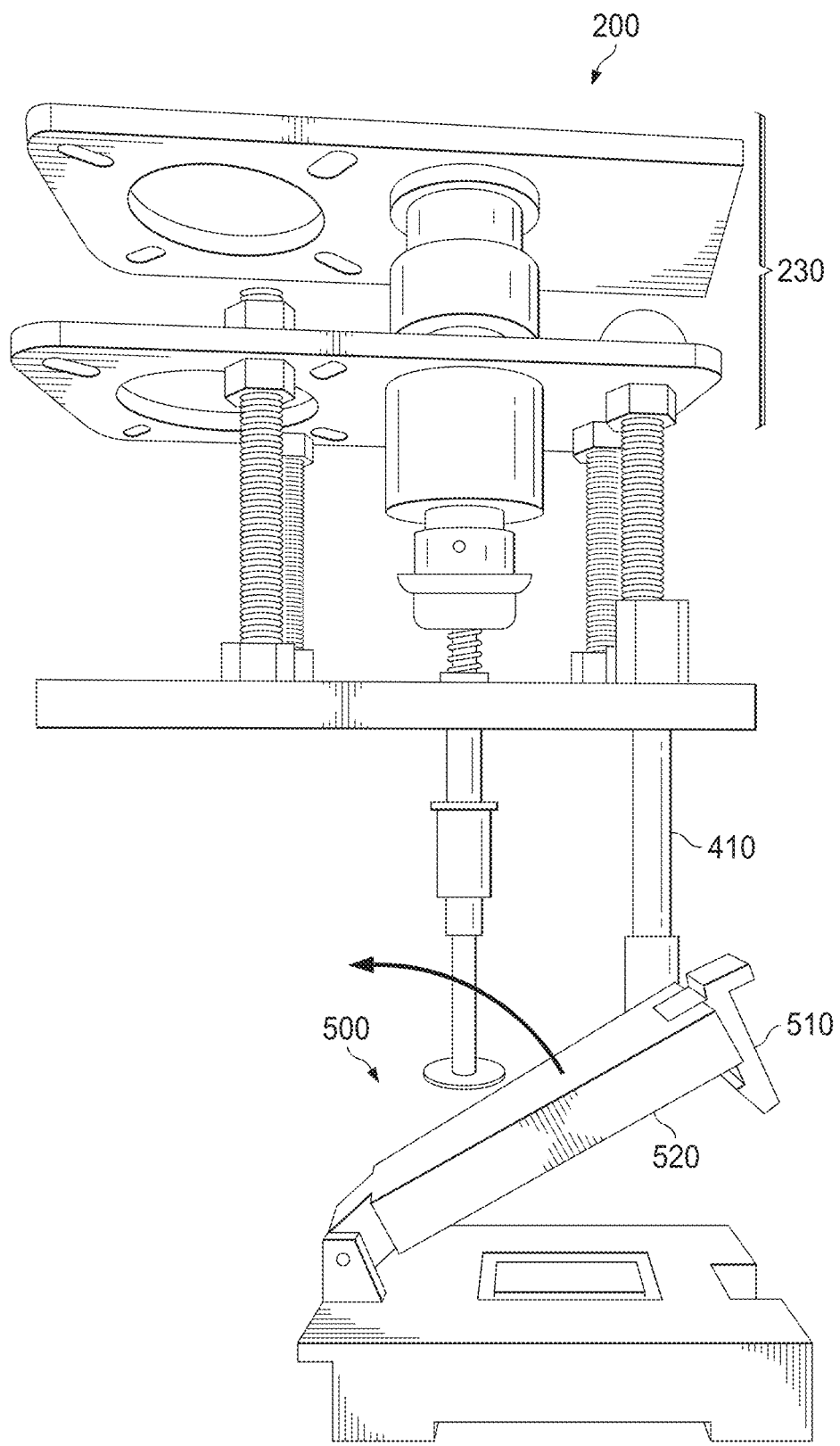
Figure 5C:
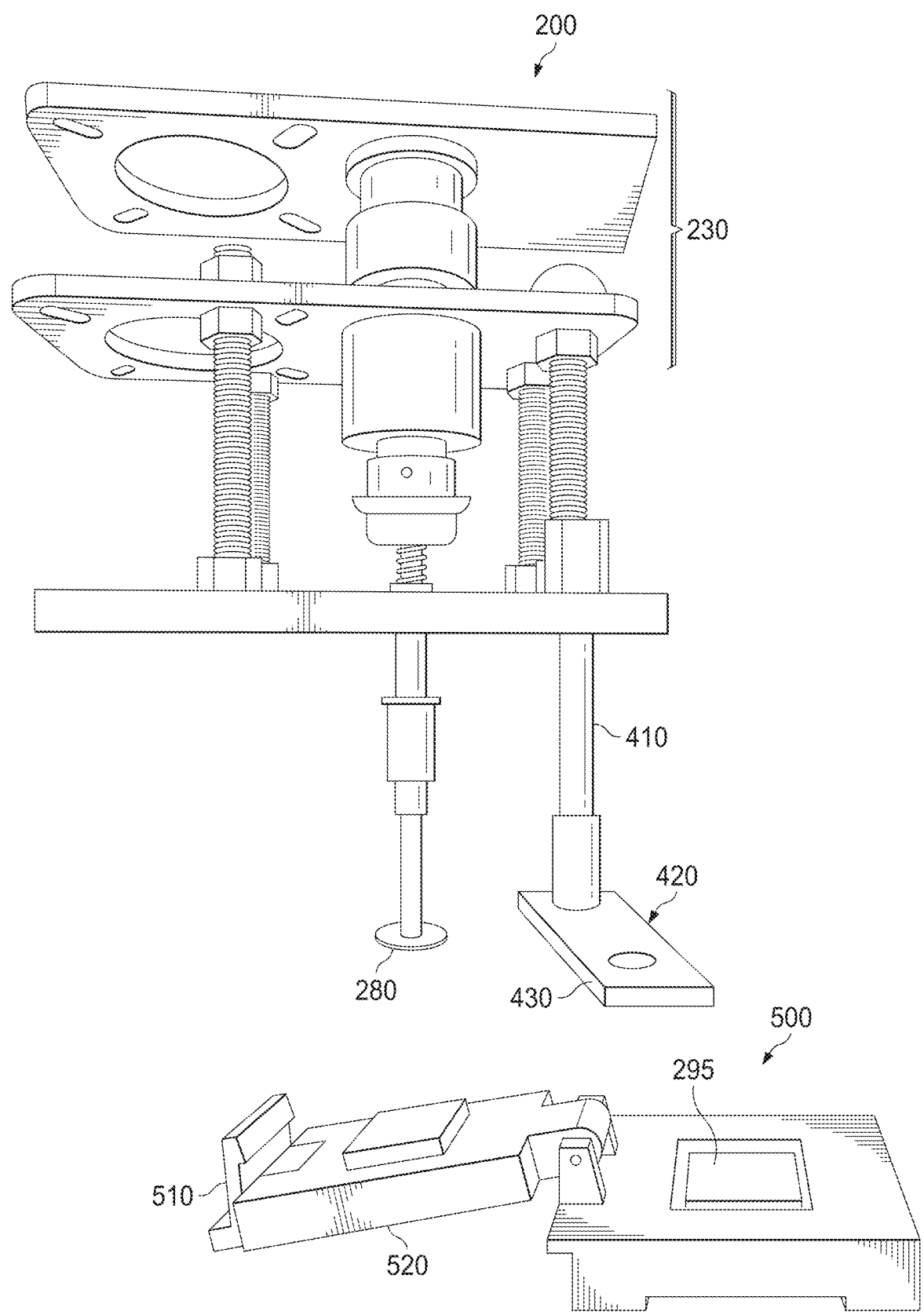
Figure 5D:
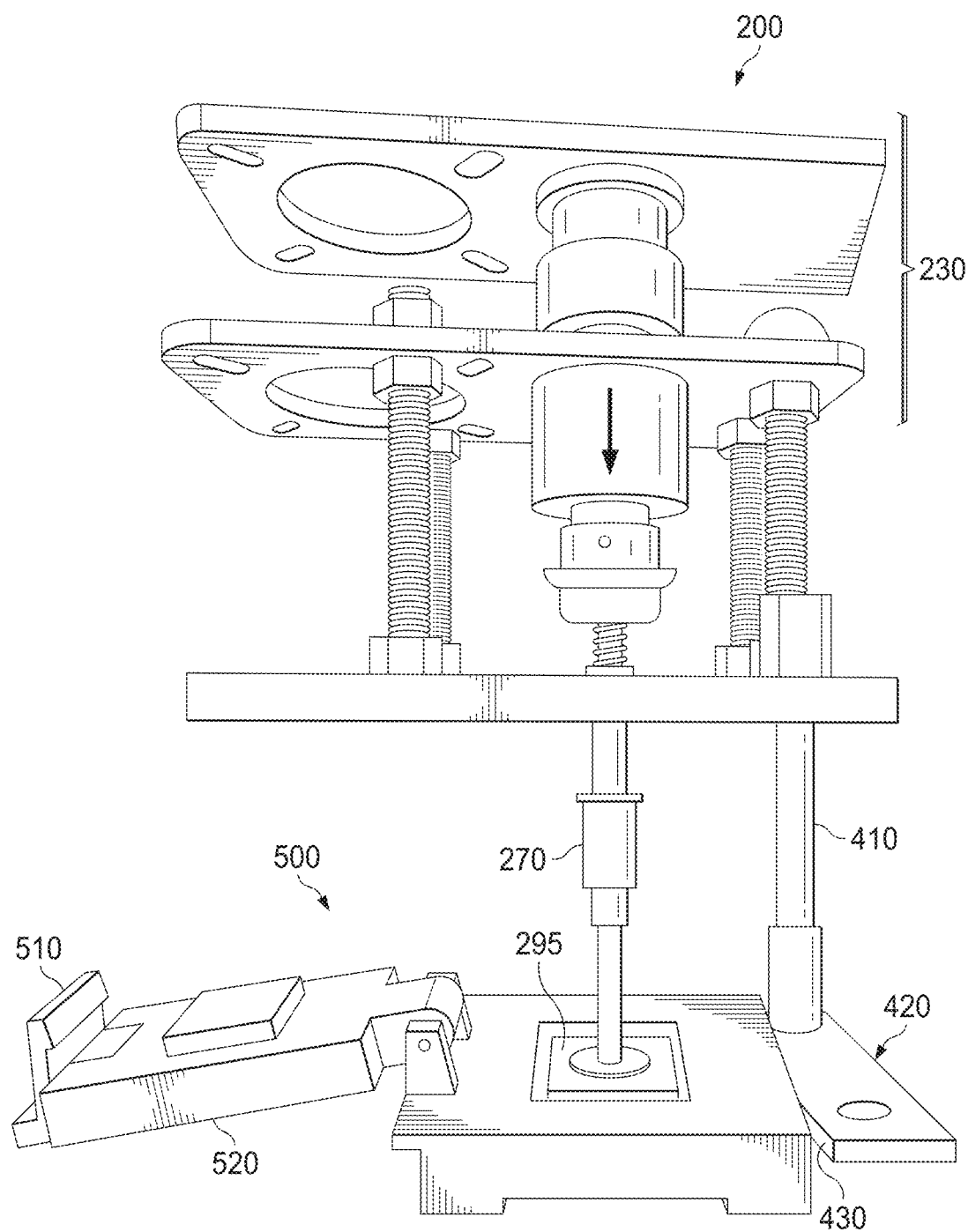

FIG. 4 illustrates foot tool 410 as an example of such a tool attached to lower bracket 250. Foot tool 410 may be attached at one the holes 360 and extend below the bottom surface of lower bracket 250 in order to better access the lid or other locking mechanism of a socket 220 (e.g., FIG. 1). Here, foot tool 410 extends downward from lower bracket 250 and includes an L-shaped foot 420 at the bottom of the foot tool 410. Foot tool 410 may also include a thin lip 430 which extends outwardly from the foot 420 in order to manipulate smaller mechanisms. Foot tool 410 may be rigidly mounted on lower bracket 250, which is rigidly mounted to upper assembly 230, which is selectively moveable upward and downward in the Z direction at the bottom of the Z support rail 140, as depicted in FIG. 1. In this manner, foot tool 410 may be moved in the X, Y and Z directions in order to manipulate a lid or other locking mechanism.

FIGS. 5A-5D illustrate example sequences in the use of the foot tool 410 to manipulate the lid 520 of a clamshell socket 500. To open the lid, the foot 420 is placed under the clamshell latch 510. The handler 200 is then raised upward, thus releasing the latch 510. The handler continues upward to lift the hinged clamshell lid 520 and expose the integrated circuit 295 within the socket 500. The handler 200 is then translated so that the longitudinal axis A (FIG. 2) of finger 270 is directly over the integrated circuit 295. The distal end of the finger 270, including the suction head 280, is then moved downward as shown by the arrow in FIG. 5D in order to contact and pick up the integrated circuit 295. Each of these actions and the positions of the handler 200 used for each movement may be pre-recorded in computer 160 by first mimicking human actions, and then later played back, together with multiple other sequences, in order to automate the testing procedure.

Figure 6A:
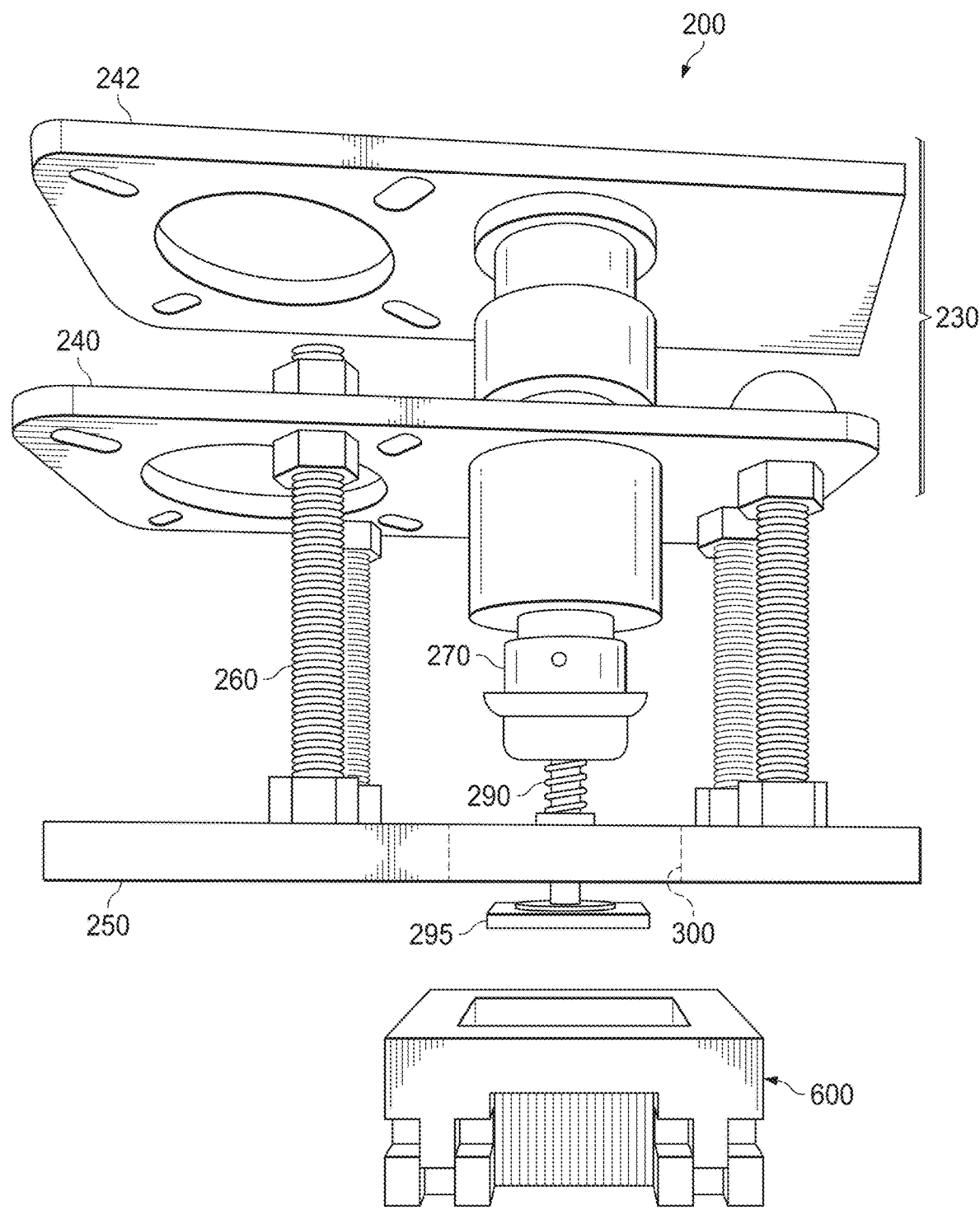
FIG. 6A is a perspective view of an example of a handler depicted holding an integrated circuit to be positioned in a spring locked socket.
Figure 6B:
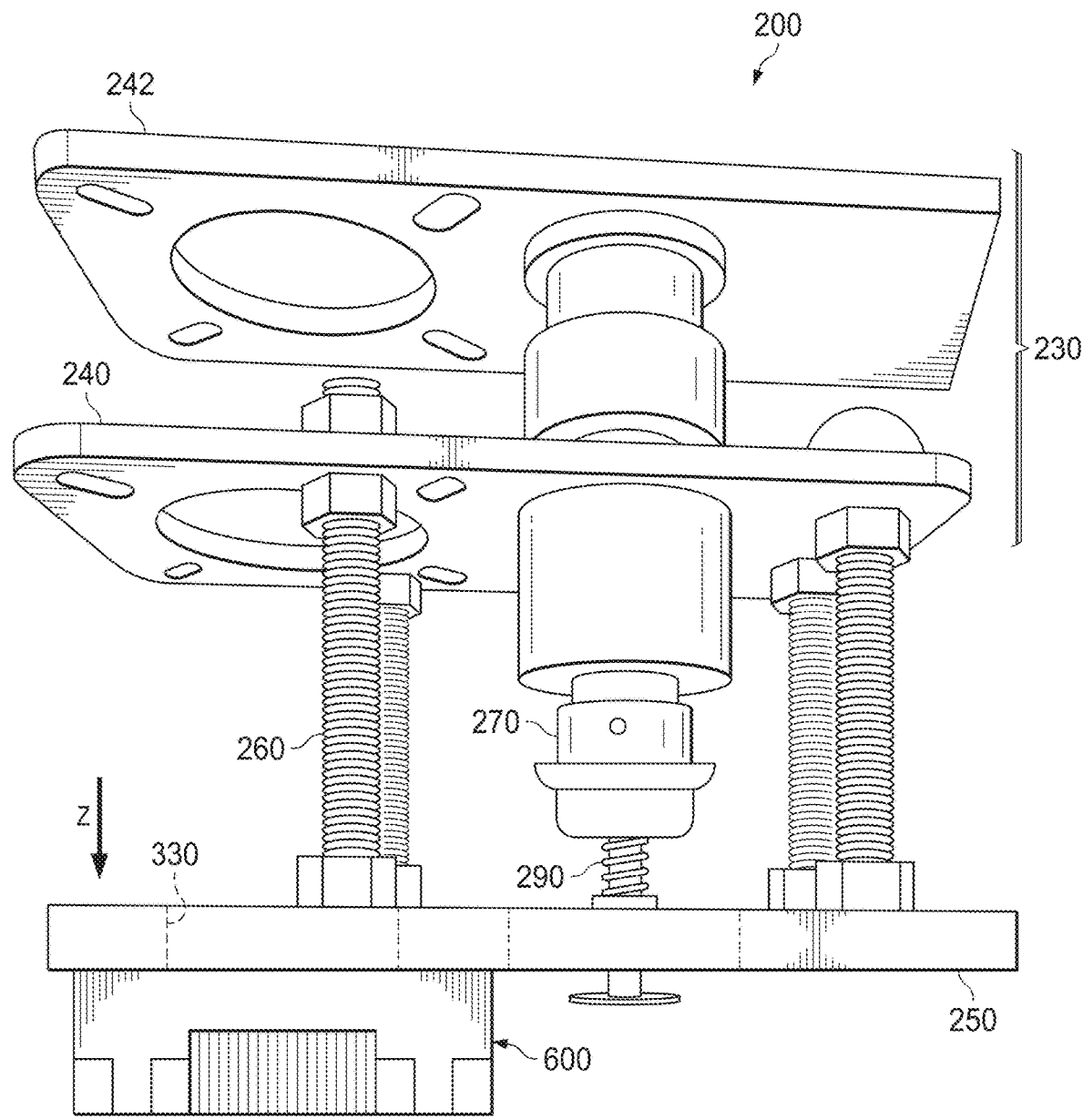
FIG. 6B is a perspective view of an example of a handler depicted closing the spring locked socket of FIG. 6A.

FIGS. 6A and 6B illustrate another example of a handler 200 used in connection with automated testing integrated circuits 295 in a spring locked socket 600. As illustrated in FIG. 6A, the handler 200 is holding an integrated circuit 295 at the distal end of finger 270 and is first translated to a position directly over the spring locked socket 600. As illustrated by the arrow in FIG. 6A, the finger 270 is then lowered through the first opening 300 in order to place the integrated circuit 295 into the socket 600. The handler 200 may then be translated in the X or Y direction so that the image sensor 330 may positioned directly over the socket 600 and the image sensor 330 used to verify the correct placement of the integrated circuit 295 (as discussed in more detail below).

Once the correct placement of the integrated circuit 295 is verified using the images sensor 330, the harder may be moved downward in the Z direction to push on the top of the socket 600 using the bottom surface of lower bracket 250, so as to lock the integrated circuit in the socket 600 for automated testing, as shown in FIG. 6B. The opposite sequence of movements may be used to remove the integrated circuit 295 from the socket 600 upon the completion of automated testing.

Figure 7A:
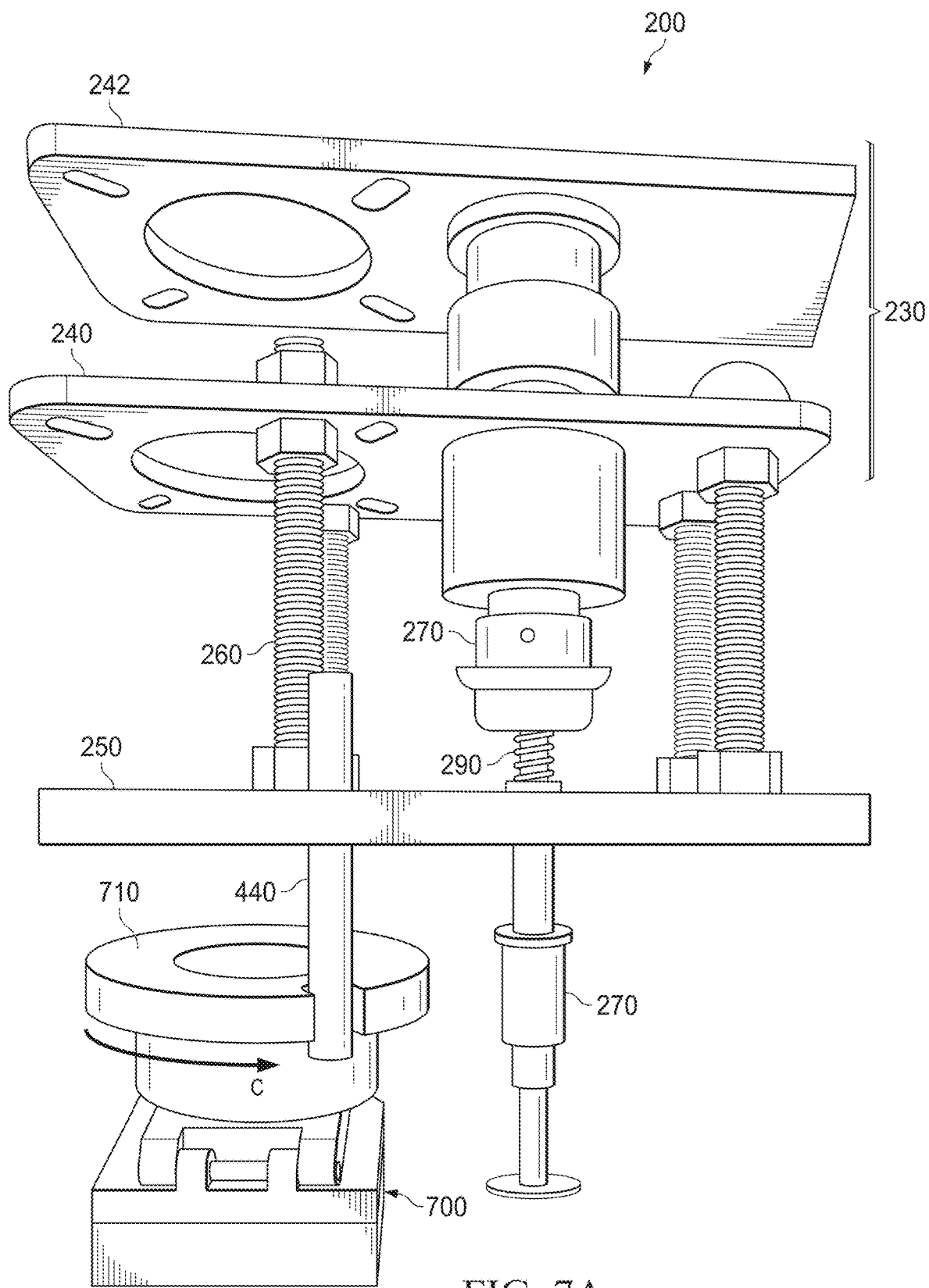
FIGS. 7A and 7B are sequential perspective views of an example handler depicted opening a screw close lid on a clamshell socket.
Figure 7B:
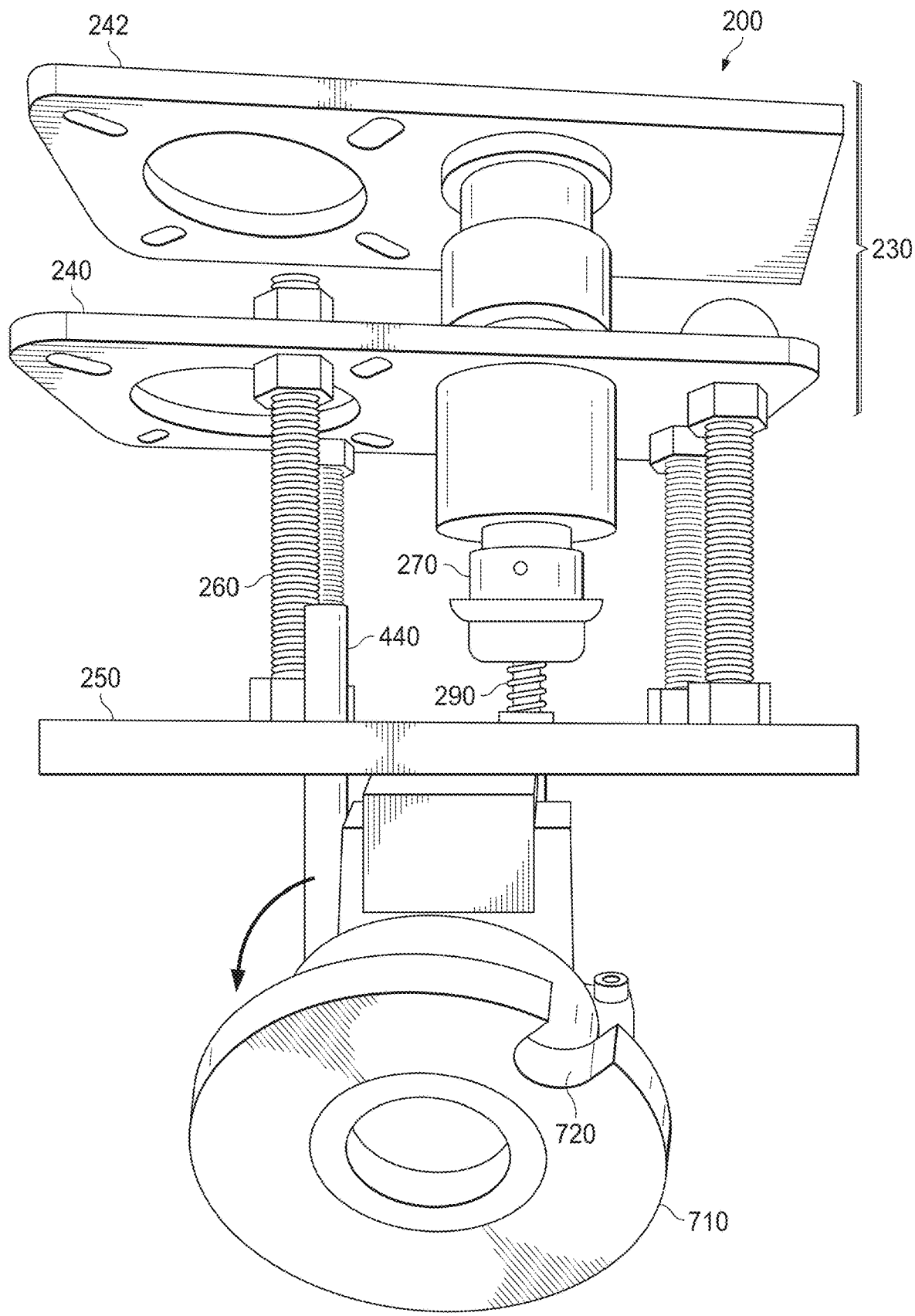

FIGS. 7A and 7B illustrate yet another example of a handler 200 used in connection with automated testing integrated circuits 295 in a screw-closed clamshell socket 700. For brevity, FIGS. 7A and 7B only illustrate the opening of the screw lid 710. Closing the lid 710 may be accomplished with similar movements made in reverse order. As illustrated in FIG. 7A, the handler 200 includes a post tool 440 attached to the lower bracket 250. Post tool 440 may be rigid rod extending downward in a direction perpendicular to the testing surface 110 (FIG. 1). The screw lid 710 includes a round top with a notch 720 on the exterior edge. The screw lid 710 is rotated clockwise to fasten the lid 710 and create electrical contact between the integrated circuit 295 and the socket 700. Conversely, the lid 710 may be rotated counter-clockwise to release the integrated circuit 295.

As illustrated in FIG. 7A, a handler 200 may automatically release the lid 710 by recording the X and Y position of the handler 200 when the post tool 440 is engaged within the notch 720. The lid 710 may be released by then translating the handler 200 and the post tool 440 in small increments in the X and Y directions to mimic a circular motion as indicated by the arrow C. As illustrated in FIG. 7B, the post tool 440 may then be translated in X and Y directions to flip open the released lid 710.

Figure 8A:
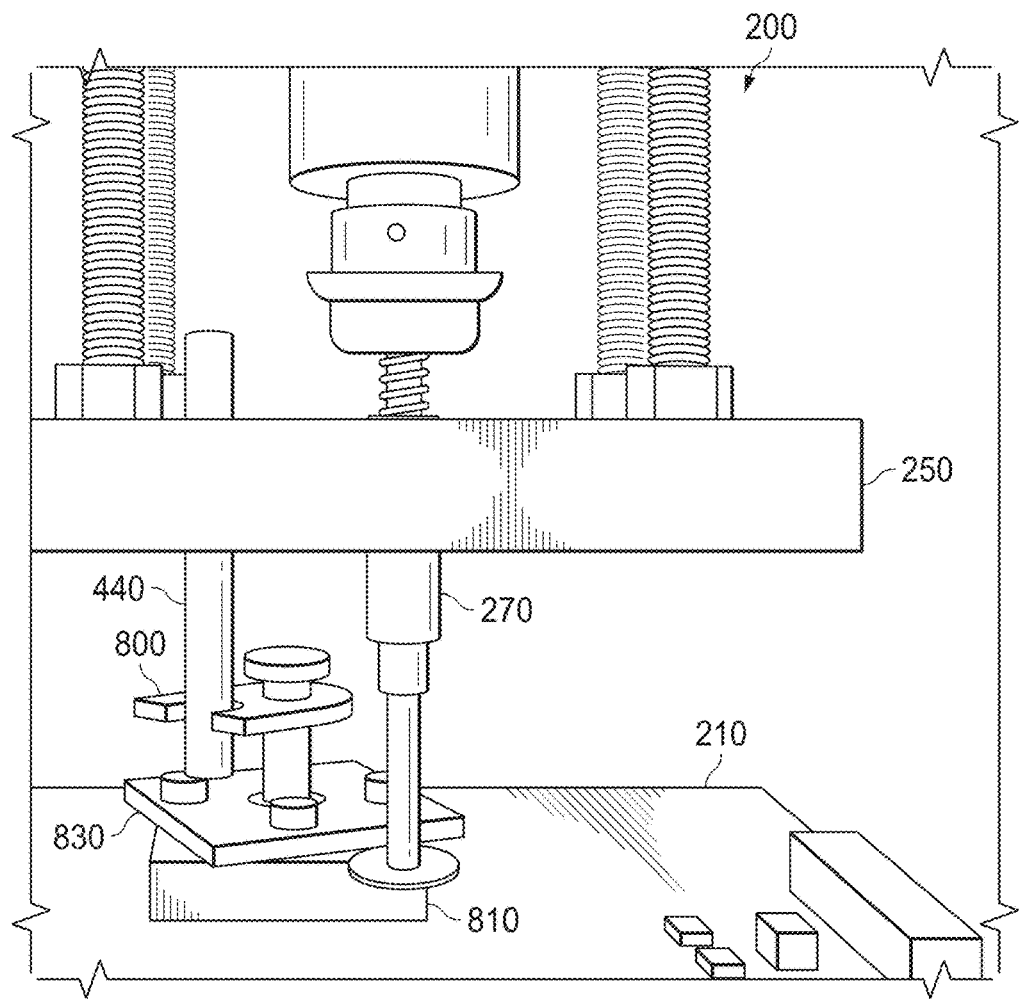
FIG. 8A is a perspective view of an example handler positioned to rotate a driver to close the lid of an Ironwood socket.
Figure 8B:
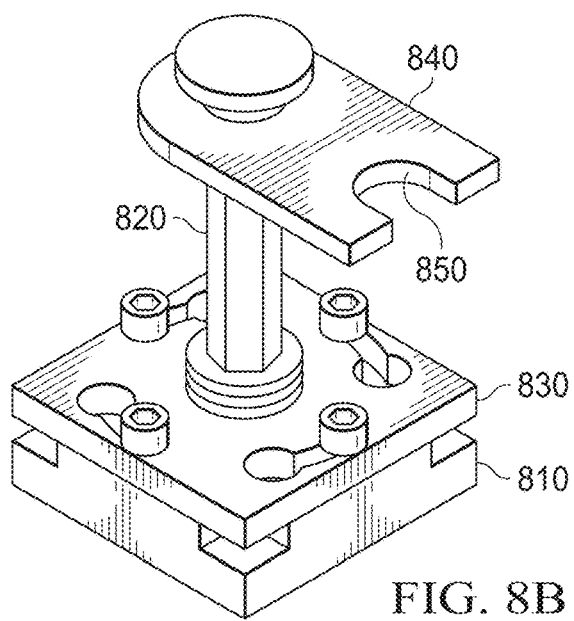
FIG. 8B is a perspective view of the driver in FIG. 8A.

Other tools may be used in conjunction with translation and upward and downward movements of the handler 200 in order to manipulate even more complex sockets 220. Referring to FIGS. 8A and 8B, there is shown a type of "BGA" socket manufactured by Ironwood Electronics of Eagan, MN (Ironwood socket 810). As shown in FIG. 8B, the socket includes a separate lid 830 that is closed by rotating or torqueing a fastener on the lid 830. In order to facilitate opening and closing such a lid, a driver 800 may be used in conjunction with a post tool 440 attached to the bottom of lower bracket 250. The driver 800 is securely attached to the lid 830 and remains with the lid 830 during automated testing. The driver 800 includes a vertical portion 820 which is securely mounted to the lid 830. The driver arm 840 extends outwardly from the vertical portion 820 and includes a notch 850 at the end.

Notch 850 on the arm 840 is adapted to engage the post tool 440 so that post tool 440 may be moved in a circular pattern to tighten or loosen the lid 830 on the Ironwood socket 810. When the lid 830 is released, it may be physically removed by the post tool 440, together with the attached driver 800, in order to access the underlying socket 810. Alternatively, the suction head 280 (FIG. 2) may be used to grip the lid 830 or the driver 800 and remove the two attached components. The lid 830 with driver 800 attached thereto may be replaced again when a new integrated circuit 295 is placed in the Ironwood socket 810 and is ready for testing.

For certain sockets 220, such as Ironwood socket 810, in order to properly fix the integrated circuit 295 in the socket 810, a fastener is torqued on the lid until communications are established with the integrated circuit 295, such as Joint Test Action Group (JTAG) communications. To satisfy such objectives, feedback may be established between the socket 810 and the handler 200. Computer 160 monitors the torque applied to the socket 810, while simultaneously listening for JTAG communications. When JTAG communications indicate a proper electrical connection between the socket 810 and the integrated circuit 295, the computer 160 signals the handler 200 to stop applying torque. Alternatively, if appropriate communications are not established within accepted guidelines, e.g., three attempts, then the testing may be terminated and the integrated circuit 295 rejected before attempting further time consuming testing procedures.

As noted above, integrated circuits 295 may also benefit from testing under controlled environmental conditions, such as in extreme heat or extreme cold. In order to create a controlled environment for such testing, the integrated circuit 295 in socket 220 is often covered by an insulated enclosure, such as a ThermoStream® device manufactured by Temptronic Corporation of Mansfield, MA. Typically, such an insulated enclosure remains positioned directly above the socket 220 so that it may be lowered to cover the socket 220, or raised upward to access the socket 220. Because this thermal enclosure is often maintained at a position directly above the socket 220, this creates an access problem for handlers which may also benefit from access to the socket 220 from directly above.

Figure 9:
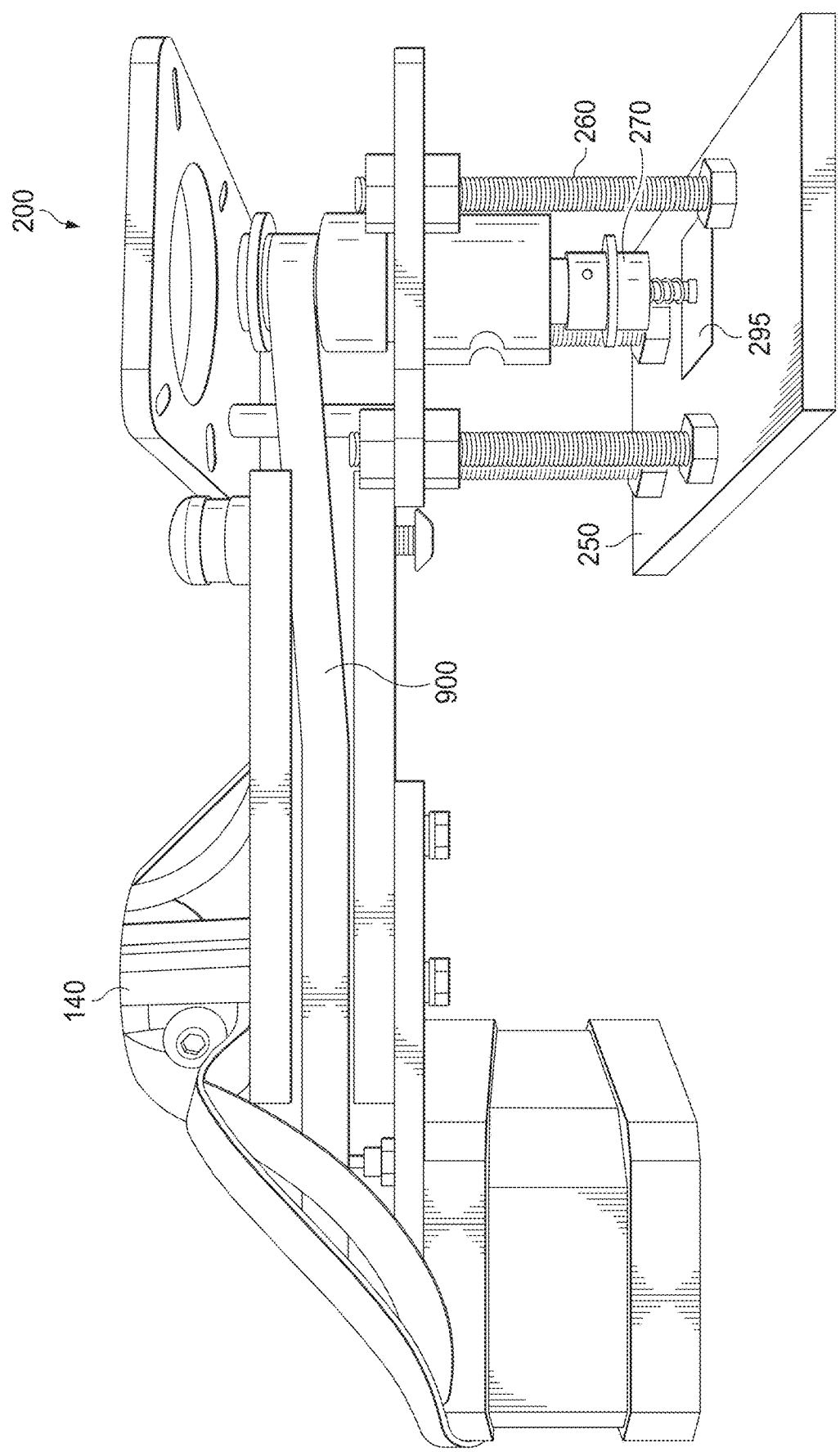
FIG. 9 is a perspective view of an example handler mounted on an arm.

Referring to FIG. 9, handler 200 may be mounted on an arm 900 which extends laterally from the lower end of Z support rail 140. In this manner, handler 200 may be used in conjunction with thermal testing by operating the handler 200 under the thermal enclosure when raised upward to access the socket 220. Thus, arm 900 facilitates the operation of handler 200 during thermal testing or other situations where overhead space is limited.

Figure 10:
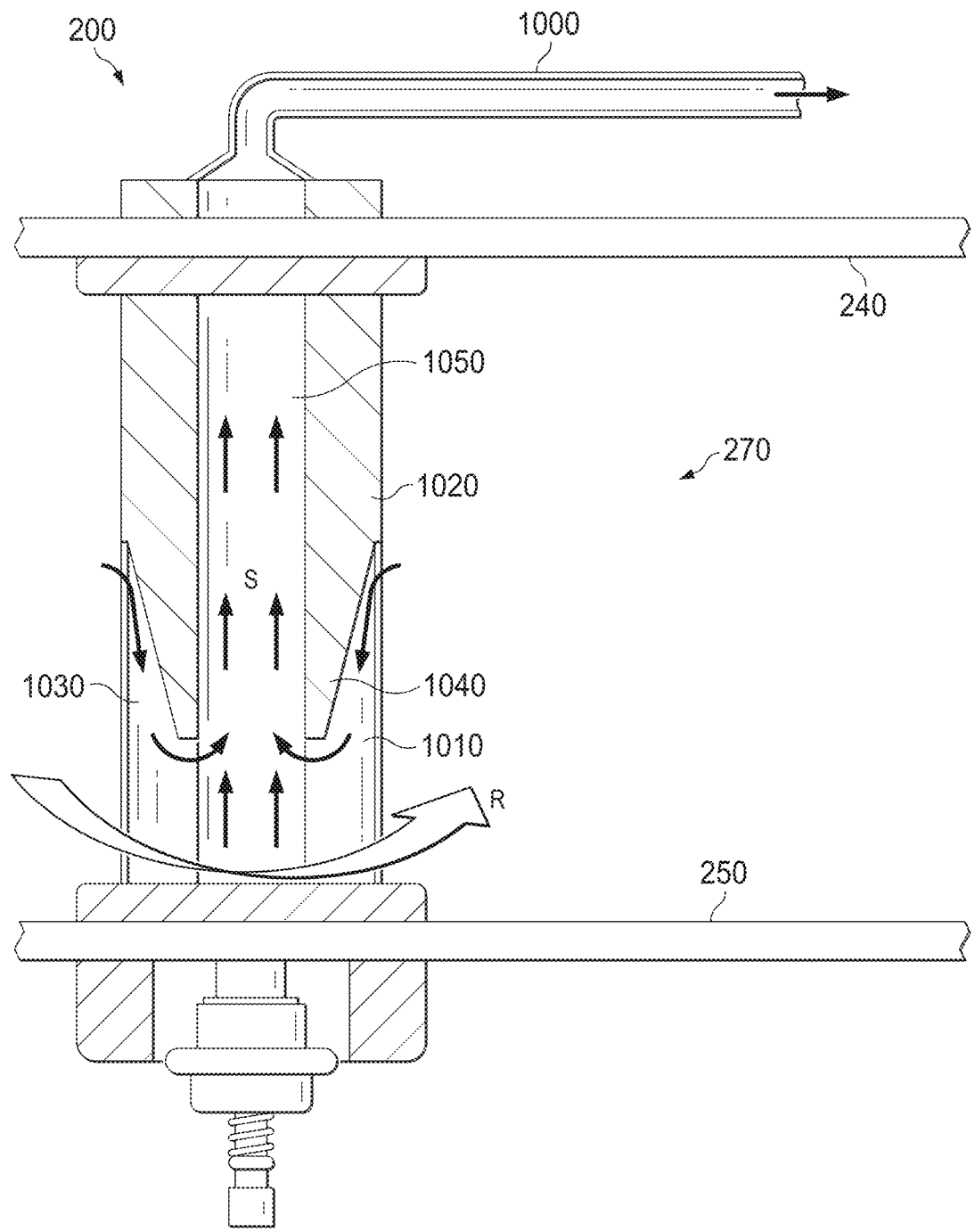
FIG. 10 is a cross section side view of an example of a rotating joint on a finger of a handler.

FIGS. 2 and 10 illustrate an example of a handler 200 which includes a finger 270 with a distal end that is adapted to selectively rotate along the longitudinal axis A, such as in the direction of arrow R. The finger 270 also includes a hollow passage 1050 which extends along the length of axis A. The hollow passage 1050 is provided as a pathway to selectively supply vacuum from an external vacuum source 1000 to the suction head 280. In this manner, the integrated circuit 295 may be quickly gripped and released without applying physical force to delicate components.

To facilitate rotation while maintaining a sealed pathway for a vacuum, the finger 270 includes a lower portion 1010 which may rotate with respect to the upper portion 1020. In order to maintain a vacuum seal between the lower portion 1010 and the upper portion 1020, the two portions are joined using conical sections that rely on Bernoulli's principle to maintain a seal at the interface between the two portions. As illustrated in FIG. 10, lower portion 1010 of finger 270 has an internal conical portion 1030 at its distal end, and adjacent upper portion 1020 of finger 270 has an external conical portion 1040 at its distal end. External conical portion 1040 fits within internal conical portion 1030 such that the upper portion 1020 and the lower portion 1010 may rotate with respect to each other. When the vacuum source 1000 is engaged, a velocity of air flows along suction line S, a portion of which flows along the interface of the two conical portions 1030 and 1040. This velocity of air flowing between the two conical portions 1030 and 1040 creates a force which tends to seal the lower portion 1010 against the upper portion 1020.

As discussed above, examples of the handler 200 are thereby translatable in X and Y directions above a testing surface 110, as well as moveable upward and downward in a Z direction perpendicular to the testing surface 110. Examples of handler 200 may further include a finger 270 that is selectively moveable upward and downward, as well as a lower portion 1010 of finger 270 that is selectively rotatable along a longitudinal axis. Examples of handler 200 are thereby adaptable to place and remove integrated circuits 295 in a socket 220 for automated testing. Examples of handler 200 are thereby further adaptable to manipulate a lid or other locking mechanism on the socket 220 without the need for human intervention.

Certain potential error conditions may occur during the process of automated testing of integrated circuits 295. By way of example, whether through human error, automation faults, or other unplanned events, an integrated circuit 295 may be missing from a position in the in the tray 150. Additionally, an integrated circuit 295 may be placed in the tray 150 with an incorrect orientation, rotation, or tilt. Worse yet, an integrated circuit 295 may have an incorrect orientation, rotation, or tilt after placement in the socket 220. Under these circumstances, if a handler 200 or a human operator were to forcibly close a lid on the socket 220 or forcibly lock the socket, the integrated circuit 295 may be destroyed or the socket 220 damaged. Any of these instances may outright stop the automated testing or drastically reduce the rate of testing while a human operator or technician intervenes to repair any damage.

For these reasons, it may provide a significant advantage to employ a handler 200 that has the capability of detecting and correcting potential error conditions. In order to facilitate these capabilities, a handler 200 may include image sensor 330, as illustrated in FIG. 3. Here, computer 160 may be programmed to selectively capture images using the sensor 330 at various stages of the automated testing. By way of example, images may be captured of the integrated circuit 295, a selected position in the tray 150, and/or the socket 220. As discussed in more detail below, these images may then be analyzed by computer 160 in order to detect any error conditions, whereupon computer 160 may either instruct the handler 200 to correct the error condition, or terminate the automated testing if an appropriate correction is not possible.

Figure 11A:
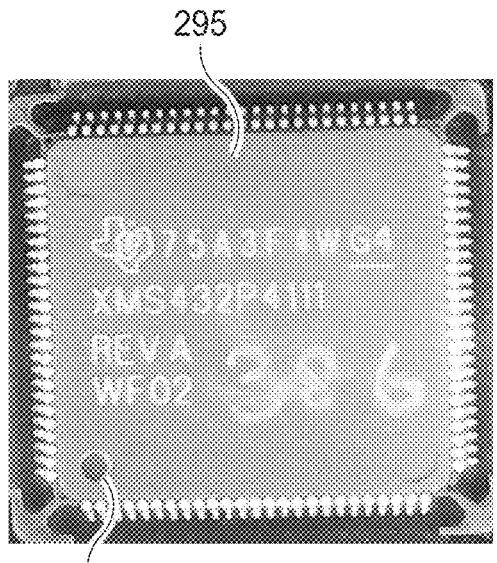
FIGS. 11A-11D show examples of images sensed by an image sensor of a handler.

Referring now to FIGS. 11A-11D, the orientation of the integrated circuit 295 may be detected by analyzing an image captured by image sensor 330. FIG. 11A is an example of an image of an integrated circuit 295. As is commonplace, the integrated circuit 295 may include a visible dot 1110 placed at a predetermined location on the surface of the integrated circuit 295 during the manufacturing process. In FIG. 11A, dot 1110 appears at the lower left corner of the integrated circuit 295. Integrated circuit 295 includes a large number of pins which extend from the perimeter and which are aligned with corresponding contacts in a socket 220. The dot 1110 is used to visually verify that the integrated circuit 295 has the correct orientation such that the pins will make contact with the appropriate contacts in socket 220.

Figure 11B:
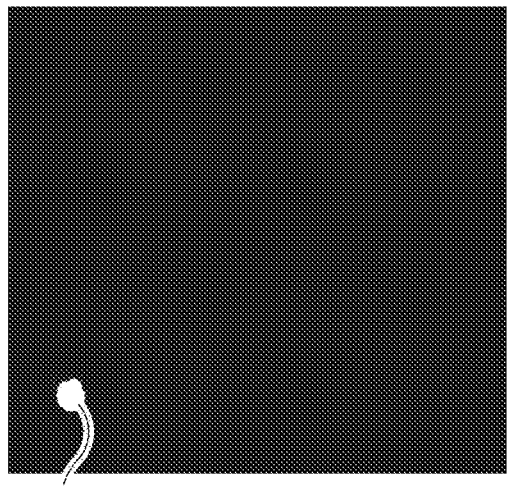

In order to detect the orientation of an integrated circuit 295 shown in FIG. 11A, the image is analyzed by computer 160 to detect the dot 1110. The remainder of the image is then ignored to yield an image as shown in FIG. 11B depicting only a dot 1120. The computer 160 may then determine the coordinates of the dot 1120 for use in determining the orientation of the integrated circuit 295.

Figure 11C:
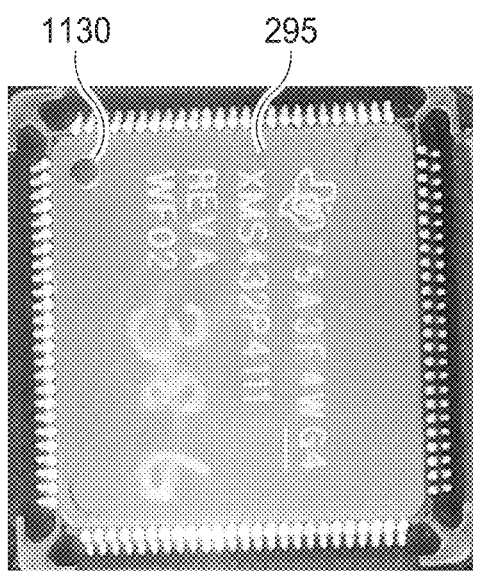
Figure 11D:
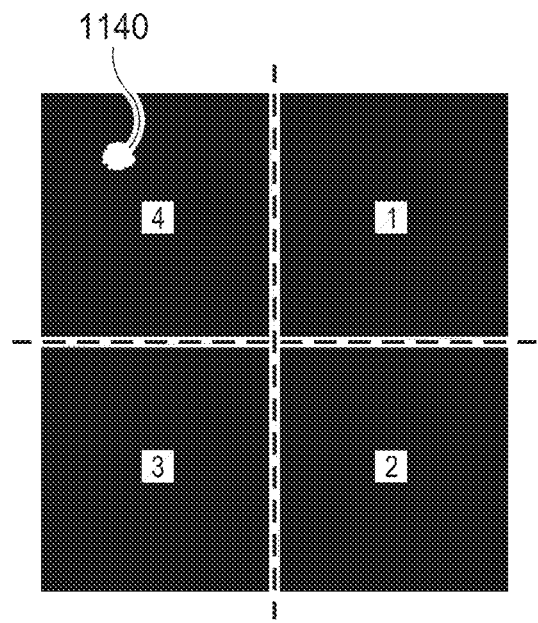

As shown in FIG. 11C, the integrated circuit 295 may have an incorrect orientation when picked up from a tray 150 or when placed in a socket 220. Here, the integrated circuit 295 has been rotated to the right by 90 degrees. A processed image is shown in FIG. 11D, which shows dot 1130 near the upper left corner of the image. The processed image in FIG. 11D is divided into four quadrants 1-4. The computer 160 then determines in which quadrant the dot 1140 appears. The dot 1140 in FIG. 11D appears in quadrant 4, which indicates that the integrated circuit is incorrectly oriented 90 degrees clockwise. The computer 160 therefore instructs the rotating lower portion 1010 of finger 270 to rotate the integrated circuit 295 by 90 degrees counterclockwise to correct the potential error condition. If the dot 1140 had instead appeared in quadrant 1, this would indicate that the integrated circuit was incorrectly oriented by 180 degrees. To correct such an error condition, the computer 160 would therefore instruct the lower portion 1010 of finger 270 to rotate the integrated circuit by 180 degrees. In a similar manner, the appearance of dot in quadrant 2 in FIG. 11D would require rotating the integrated circuit by 90 degrees clockwise.

Figure 12A:
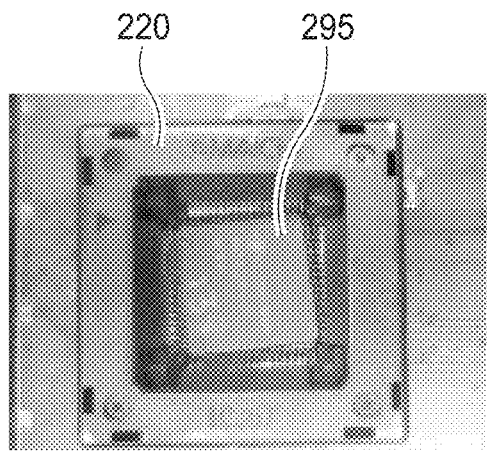
FIGS. 12A-12D show examples of other images sensed by an image sensor of a handler.

In additional to potential errors involving an incorrect orientation, an integrated circuit 295 may also be unexpectedly rotated by an angle less than 90 degrees, as illustrated in FIG. 12A. As before, FIG. 12A depicts an example image of an integrated circuit 295 taken by image sensor 330 from above the socket 220. Here, the image in FIG. 12A was sensed immediately after the integrated circuit 295 was placed in the socket 220. If a lid were forcibly closed on the socket 220 under these circumstances, there is a significant likelihood that the integrated circuit 295 and/or the socket 220 would be damaged or destroyed, thus causing a significant interruption to the automated testing process.

Figure 12B:
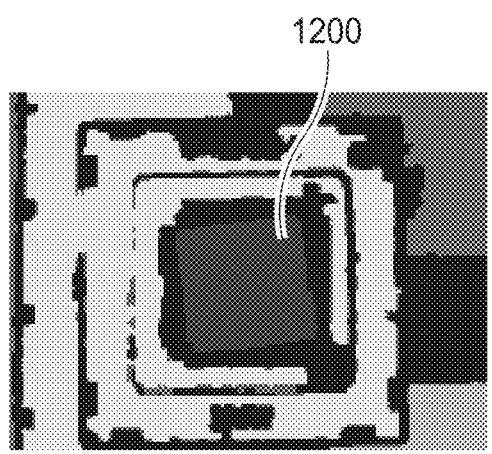
Figure 12C:
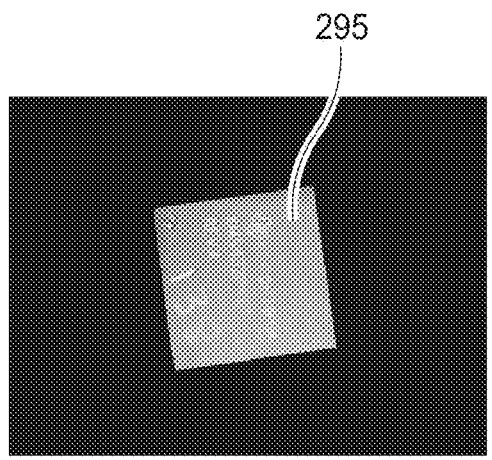
Figure 12D:
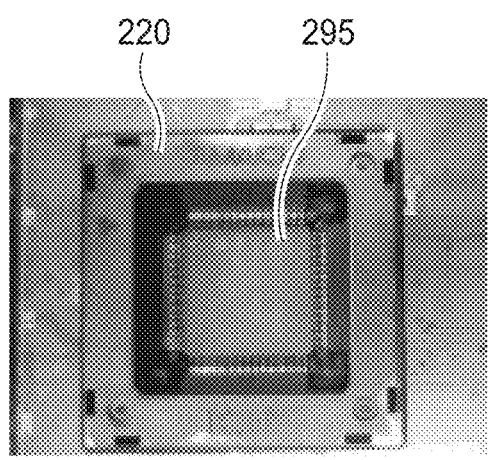
Figure 13:
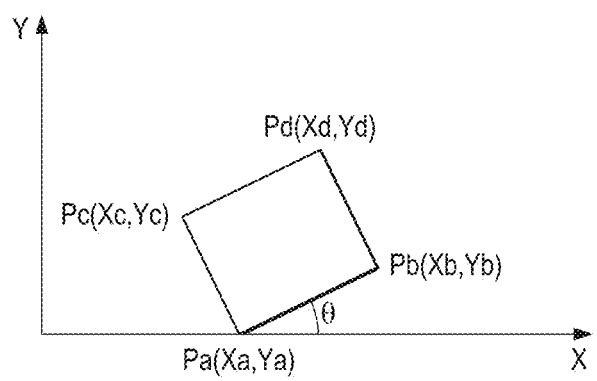
FIG. 13 is an illustration of detecting the rotation of an integrated circuit in an image sensed by an image sensor of a handler.

In order to detect potential rotation of the integrated circuit 295, an image such as shown in FIG. 12A is analyzed by computer 160 to detect the major shapes or blobs in the image. The resulting image is shown in FIG. 12B, wherein the shape of the integrated circuit 295 is appears in the center of the image. The remainder of the image is then ignored, as shown in FIG. 12C wherein the maximum X and Y extents of the shape define the corners of the rotated integrated circuit 295. The points of the corners of the rotated rectangle defining the integrated circuit 295 are designated Pa, Pb, Pc, and Pd in FIG. 13.

Each of the points defining the corners of the rotated rectangle have X and Y coordinates, i.e., Pa (Xa, Ya), Pb (Xb, Yb), Pc (Xc, Ye), and Pd (Xd, Yd). Here, the base of the integrated circuit is represented by the line Pa→Pb. For a non-rotated integrated circuit 295, the angle Θ between the line Pa→Pb and the X-axis should be zero (0). If this angle Θ is not zero (0), the computer 160 may instruct the lower portion 1010 of finger 270 to rotate the integrated circuit by an angle Θ in the opposite direction. An error in the rotation of integrated circuit 295 may thereby be corrected by handler 200 without human intervention and as an integral part of the automated testing process.

In addition to orientation errors and rotation errors, an integrated circuit 295 may also be tilted in the socket 220. By "tilted," it is implied that a plane formed by the surface of integrated circuit 295 is not parallel to the testing surface 110, such that the integrated circuit 295 would appear tilted up or tilted down with respect to the testing surface 110. As with other types of errors, a potential error due to tilt of the integrated circuit 295 may be detected by using the computer 160 to analyze an image of the integrated circuit 295 sensed by the image sensor 330. FIGS. 14A-14D are example images of a tilted integrated circuit 295 placed into a socket 220.

Figure 14A:
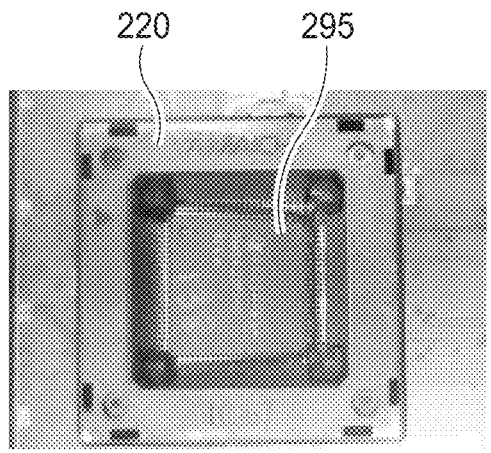
FIGS. 14A-14D show examples of other images sensed by an image sensor of a handler.
Figure 14B:
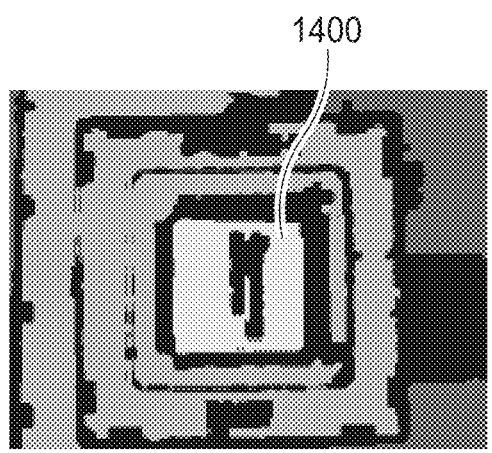
Figure 14C:
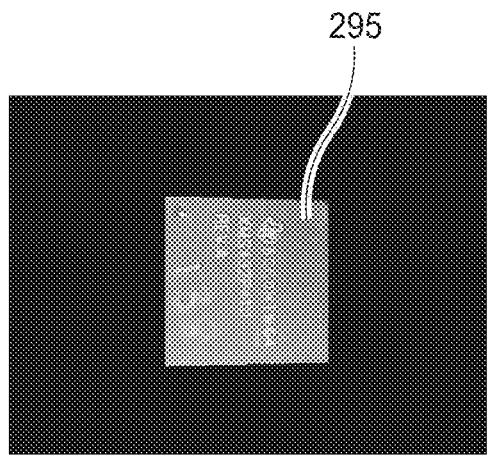
Figure 14D:
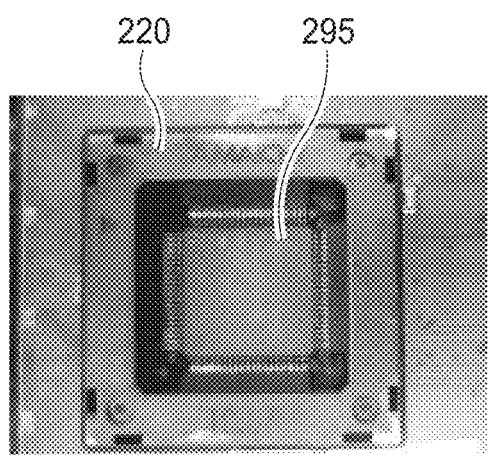
Figure 15:
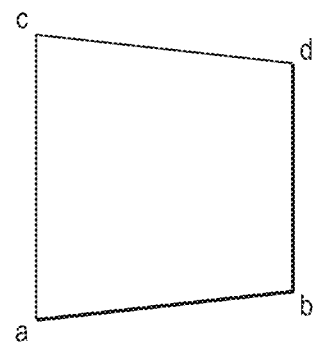
FIG. 15 is an illustration of detecting a tilted integrated circuit in an image sensed by an image sensor of a handler.

Referring to FIGS. 14A-14D, the image of integrated circuit 295 is first processed to detect the shapes or blobs in the image, as shown in FIG. 14B. The central shape of the integrated circuit 295 is then retained and the remainder of the image is ignored, as illustrated in FIG. 14C. The resulting image has the form of a quadrilateral depicted in FIG. 15, with points a, b, c, and d as the corners. The length of each of the four edges (ab, bd, dc, and ca) is calculated by the computer 160. If any two edges are equal and the remaining two edges are not equal, this indicates that the quadrilateral is not a rectangle, and thus, the integrated circuit 295 is tilted. If a tilt is detected, then the computer 160 directs the finger 270 to pick up the integrated circuit using the suction head 280, replace the integrated circuit 295 in the socket 220, and sense another image using image sensor 330 for further analysis. Typically, such a procedure corrects a tilted integrated circuit 295.

Figure 16A:
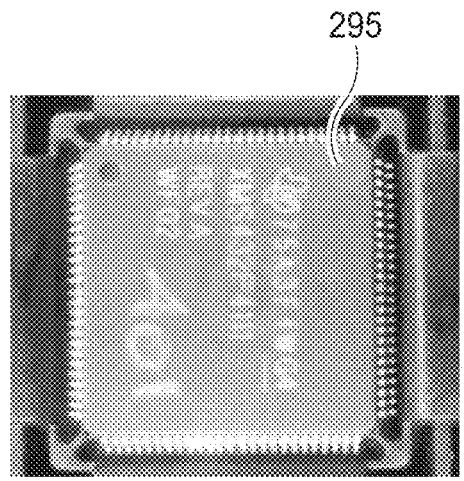
FIGS. 16A-16D show other examples of images sensed by an image sensor of a handler.
Figure 16B:
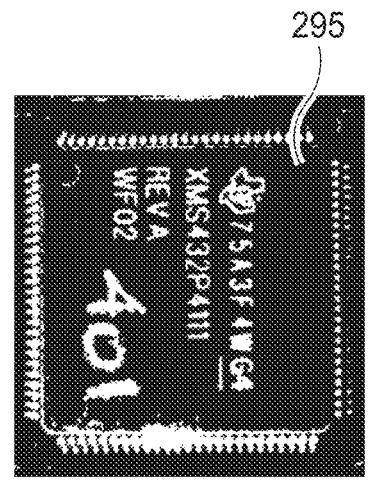
Figure 16C:
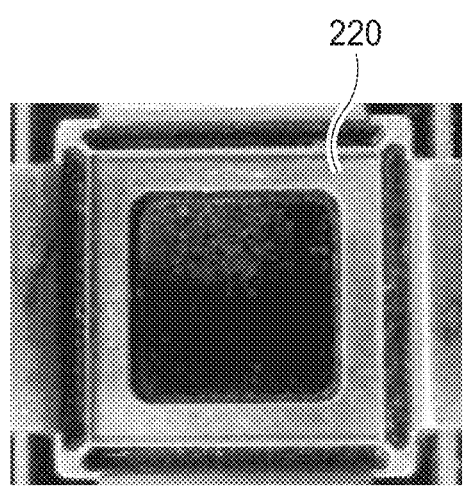
Figure 16D:
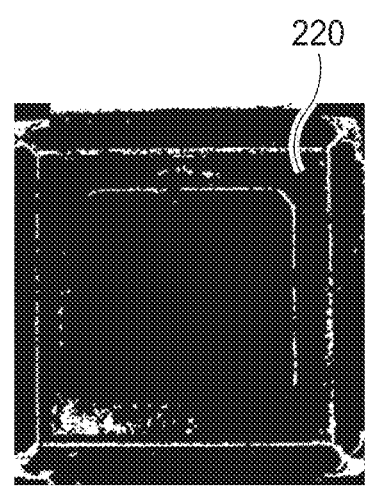

FIGS. 16A-16D provide examples of the types of images sensed by image sensor 330 in order to detect a potential error condition resulting from a missing integrated circuit 295. For example, referring also to FIGS. 1 and 2, an integrated circuit 295 may be missing from a designated position in tray 150. Such an error may be automatically corrected by handler 200 by simply skipping that position in the tray 150. In order to detect such a missing integrated circuit 295, an image of the position to analyze, e.g., a position in tray 150, is sensed by image sensor 330, as shown in FIGS. 16A and 16C. These images are then reduced in color depth to black and white images, as shown in FIGS. 16B and 16D. In the black and white images, the number of white pixels is counted and compared to the average number of white pixels that are contained in a reference image that is known to contain an integrated circuit.

As illustrated in FIG. 16D, if the number of white pixels in the sensed image is significantly less than the number of white pixels in the known reference image, e.g., less than 60%, then the computer 160 determines that the sensed image does not contain an integrated circuit 295. If the computer 160 determines that the sensed image does not contain an integrated circuit 295, then the position in tray 150 may be skipped or other remedial action taken. Conversely, as illustrated in FIG. 16B, if the number of white pixels in the sensed image is not significantly less than the number of white pixels in the reference image, then the computer 160 determines that the sensed image does contain an integrated circuit 295, in which case automated testing may proceed.

Numerous other variations of the foregoing error detection and correction techniques may be employed, including additional techniques involving the analysis of images sensed by image sensor 330. The described techniques and additional techniques may be used by handler 200 to detect and correct error conditions without human intervention. This automated detection and correction of potential error conditions may enable the continuous use of handler 200 with no human supervision or less human supervision than systems which do not detect and correct potential error conditions.

In the foregoing discussion and in the claims, the terms "including" and "comprising" are used in an open-ended fashion, and thus should be interpreted to mean "including, but not limited to" Also, the term "couple" or "couples" is intended to mean either an indirect or direct wired or wireless connection. Thus, if a first device couples to a second device, that connection may be through a direct connection or through an indirect connection via other devices and connections. Terms such as "parallel," "perpendicular," and the like are to be interpreted to allow for an error of plus or minus 15 degrees from the stated orientation or configuration.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus for handling integrated circuits in automated testing, the apparatus comprising:
   an upper assembly selectively translatable above a testing surface;
   a lower bracket extending from and positioned below the upper assembly, wherein the lower bracket
      extends in a plane of the testing surface,
      forms a first opening, and
      is selectively moveable perpendicular to the plane of the testing surface; and
   a finger having a longitudinal axis extending downward from the upper assembly, wherein
      a lower portion of the finger is selectively rotatable about the longitudinal axis,
      a distal end of the finger extends downward toward the first opening in the lower bracket, and
      the finger is selectively moveable upward and downward with respect to the lower bracket to pick up and place an integrated circuit in a socket.

2. The apparatus of claim 1 wherein the lower bracket and finger are mounted on an arm that extends in the direction of the plane of the testing surface to facilitate securing and removing the integrated circuit under a testing device that is positioned above the socket.

3. The apparatus of claim 1 further comprising an image sensor positioned to capture images of the integrated circuit positioned beneath the first opening.

4. The apparatus of claim 3 further comprising a second opening in the lower bracket, and wherein the image sensor is positioned to capture images through the second opening.

5. The apparatus of claim 1 wherein the distal end of the finger is selectively moveable through the first opening in the lower bracket.

6. The apparatus of claim 1 wherein the lower bracket is spaced apart from the upper assembly and is supported beneath the upper assembly by a plurality of adjustable spacers.

7. The apparatus of claim 1 further including a computer including a memory, wherein the computer is in communication with the upper assembly, such that the upper assembly may be translated to a predetermined position stored in the memory.

8. The apparatus of claim 7 wherein the memory is configured to store a predetermined upward or downward position of the finger with respect to the socket, such that the finger may be moved upward or downward to the predetermined position.

9. The apparatus of claim 1 further including a suction head positioned on the distal end of the finger, wherein the suction head is configured to selectively retain and release the integrated circuit positioned thereon.

10. The apparatus of claim 9 wherein the finger is configured to move the suction head below the first opening when the distal end of the finger is extended downward.

11. The apparatus of claim 9 wherein the finger includes an axial spring configured to cushion an impact of the suction head on the integrated circuit.

12. The apparatus of claim 9 further including a vacuum source to selectively supply a vacuum to the suction head.

13. The apparatus of claim 12 wherein the finger and the lower portion of the finger are hollow to form a passage for the vacuum.

14. The apparatus of claim 13 wherein
the finger further comprises an upper portion, and
the upper portion and lower portion of the finger each include a conical portion aligned with the longitudinal axis of the finger,
wherein one conical portion is internal and the other conical portion is external, and the external conical portion is configured to extend within the internal conical portion to join the upper portion and the lower portion.

15. The apparatus of claim 1 wherein a portion of the lower bracket surrounding the first opening forms a perimeter configured to apply pressure to a lid of the socket when the lower bracket is moved toward the plane of the testing surface and thus close or release the lid.

16. The apparatus of claim 15 wherein
the finger is selectively moveable upward such that the distal end of the finger is above the perimeter of the first opening,
and the finger is selectively moveable downward such that the distal end of the finger is below the perimeter of the first opening.

17. The apparatus of claim 1 further including a tool attached to the lower bracket and extending below the lower bracket to open and close a lid on the socket.

18. The apparatus of claim 17 wherein the tool includes a lip that is displaced below the lower bracket and extends in the plane of the testing surface, and the lip is configured to engage a latch on the lid of the socket.

19. The apparatus of claim 17 wherein the tool is a post extending perpendicular to the plane of the testing surface, and the distal end of the post is configured to engage a rotating lid on the socket when the upper assembly is translated in a circular pattern in the plane of the testing surface.

20. The apparatus of claim 17 wherein the tool is a post extending perpendicular to the plane of the testing surface, and the apparatus further includes a driver with a vertical portion and a horizontal arm, wherein
a distal end of the vertical portion is configured to engage a rotating mechanism on the lid of the socket, and
a distal end of the horizontal arm is configured engage the post, such that translation of the upper assembly in a circular pattern in the plane of the testing surface rotates the rotating mechanism on the lid of the socket.

* * * * *